(12) United States Patent
Akashi et al.

(10) Patent No.: US 6,645,296 B2
(45) Date of Patent: Nov. 11, 2003

(54) CRYSTAL HOLDING APPARATUS

(75) Inventors: Yoshihiro Akashi, Saga (JP); Teruo Kageyama, Saga (JP)

(73) Assignee: Sumitomo Mitsubishi Silicon Corporation, Ltd., Tokyo (JP)

(*) Notice: Subject to any disclaimer, the term of this patent is extended or adjusted under 35 U.S.C. 154(b) by 0 days.

(21) Appl. No.: 10/038,865

(22) Filed: Jan. 8, 2002

(65) Prior Publication Data

US 2002/0117106 A1 Aug. 29, 2002

(51) Int. Cl.[7] ............................................. C30B 38/00
(52) U.S. Cl. ..................... 117/118; 117/208; 117/217; 117/911
(58) Field of Search ................... 117/208, 217, 117/218, 911

(56) References Cited

U.S. PATENT DOCUMENTS

| | | | |
|---|---|---|---|
| 5,938,843 A | * | 8/1999 | Hiraishi et al. ............. 117/218 |
| 6,063,189 A | * | 5/2000 | Hiraishi ...................... 117/218 |
| 6,139,633 A | * | 10/2000 | Nishiura ...................... 117/208 |
| 6,228,167 B1 | * | 5/2001 | Kuramoto et al. .......... 117/208 |

FOREIGN PATENT DOCUMENTS

| | | | | |
|---|---|---|---|---|
| JP | 10-081582 | * | 3/1998 | ........... C30B/15/30 |
| JP | 10-081583 | * | 3/1998 | ........... C30B/15/30 |

* cited by examiner

*Primary Examiner*—Felisa Hiteshew
(74) *Attorney, Agent, or Firm*—Morrison & Foerster LLP

(57) ABSTRACT

To miniaturize a crystal holding apparatus which mechanically holds and pulls up a single crystal at a top thereof. To avoid harmful influence on crystal growing resulting from crystal holding. A plurality of pivot clamps 40, 40 are circumferentially mounted at regular intervals on a cylindrical frame 30 which lifts and lowers and rotates for pulling up the single crystal. A clamp operation mechanism 50 is incorporated in the frame 30, which is pushed by a seed chuck 2 lifting in the frame 30 to shift the pivot clamps 40, 40 from an open condition to a close condition. The clamp operation mechanism 50 shifts the pivot clamps 40, 40 from the open condition to close condition when a neck passes inside the pivot clamps 40, 40, and release the pivot clamps 40, 40 after the shift.

12 Claims, 7 Drawing Sheets

(a)

(b)

CRYSTAL HOLDING APPARATUS

BACKGROUND OF THE INVENTION

1. Field of the Invention

The present invention relates to a crystal holding apparatus which is used for growing a single crystal by a CZ method, and more particularly to a crystal holding apparatus used for crystal holding and pulling, which mechanically holds and pulls up a grown crystal at a top thereof.

2. Description of the Prior Art

As a material for a silicon wafer used for manufacturing a semiconductor device, a silicon single crystal is often used which is manufactured by the CZ method. In manufacture of the silicon single crystal by the CZ method, as known, a seed crystal held by a bottom of a pulling shaft is immersed in a silicon melt formed in a crucible, and from this condition, the pulling shaft is lifted with rotation to thereby grow the silicon single crystal below the seed crystal.

The seed crystal is in the form of a narrow rod constituted by the silicon single crystal with a diameter on the order of 10 and few mm, and a top thereof is coupled to a seed holder, and a bottom thereof is immersed in the silicon melt. When such a seed crystal is immersed in a hot silicon melt, dislocation occurs due to thermal shock. For this reason, "necking" is carried out which narrows a diameter of the seed crystal after immersion of the seed crystal in the silicon melt and maintains the state for a while to eliminate the dislocation of the crystal. A required diameter of a neck is under 5 mm in terms of eliminating the dislocation, and a desired diameter is under 3 mm.

A mainstream silicon single crystal manufactured by the CZ method has had a diameter of 8 inch and a weight around 100 kg. Recently, however, a single crystal has been further upsized, and test manufacture of a silicon single crystal with a diameter of 12 inch has started.

An increased diameter of the single crystal greatly increases a weight thereof, and the single crystal with the diameter of 12 inch reaches a weight of 200 to 300 kg. The highest concentration of the weight is on the neck which is positioned at the top of the single crystal and is the smallest diameter portion, but breaking strength of the silicon is 20 $kg/mm^2$, so that the neck needs to have a diameter of more than 5 mm for surely holding a silicon single crystal even of 200 kg. Therefore, stable pulling of the single crystal of 12 inch is impossible in terms of crystal holding.

As an especially effective technique of resolving this contradiction, there is crystal holding and pulling which does not depend on a neck. In the techniques described in the Japanese Patent Publication No. 5-65477 specification, Japanese Patent Laid-Open No. 10-81582 specification, Japanese Patent Laid-Open No. 10-81583 specification, or the like, as shown in FIG. 7, a seed crystal 3 held by a seed chuck 3 is necked, then below a neck 11, a stopped portion 12 is formed which has a larger diameter than the neck 11 and is capable of mechanical holding, and a conventional body 13 is formed therebelow. When the stopped portion 12 is formed, a crystal holding apparatus 20 mechanically holds the stopped portion 12 to pull up a single crystal 10.

In order to prevent falling of the single crystal 10, the stopped portion 12 generally has a shape with a wide upper portion and narrow lower portion, and the narrow lower portion is set to have a sufficiently larger diameter than the neck. The wide upper portion is like a knob, and the lower portion is necked with respect to a body 13 therebelow, so that the stopped portion 12 is called a knob portion or necking portion.

A known crystal holding apparatus 20 has a cylindrical frame 21 which lifts and lowers and rotates for pulling up a single crystal 10 and which is circumferentially mounted with a plurality of pivot clamps 22, 22 at regular intervals. A pulling shaft 1 used for growing the single crystal 10 is inserted in the frame 21, and a seed chuck 2 coupled to a bottom of the pulling shaft 1 is pulled into the frame 21 with growth of the single crystal 10. A plurality of pivot clamps 22, 22 are brought into close condition by inward pivoting, grasp the stopped portion 12 of the single crystal 10 in the close condition, and are pivotable upward from the close condition.

General use of the crystal holding apparatus 20 using the pivot clamps 22, 22 will be as described below.

The crystal holding apparatus 20 brings the pivot clamps 22, 22 into the close condition and waits above the single crystal 10. When the single crystal 10 grows in this state, the seed chuck 2 first passes inside the pivot clamps 22, 22. The neck 11 of the single crystal 10 then passes, and the stopped portion 12 enters inside the pivot clamps 22 to be automatically grasped. Then, the frame 21 starts lifting and rotating synchronously with the pulling shaft. After that, the single crystal 10 is mechanically held and pulled up at the stopped portion 12 by the crystal holding apparatus 20. The pivot clamps 22, 22 are pivotable upward from the close condition and do not prevent passage of the seed chuck 2 and entry of the stopped portion 12.

As described above, the crystal holding apparatus 20 using the pivot clamps 22, 22 has a simple structure which requires no operation mechanism of the pivot clamps 22, 22, and for this advantage, the pivot clamps 22, 22 are generally set to the close condition from the beginning and not especially operated. However, it is also considered in some crystal holding apparatuses 20 that pivot clamps 22, 22 are set to an open condition, and after entry of a stopped portion 12 inside the pivot clamps 22, 22, a push rod is pushed up at a body 13 (shoulder) of a single crystal 10 to operate the pivot clamps 22, 22 to a close condition (Japanese Patent Laid-Open No. 10-81582 specification).

However, the conventional crystal holding apparatus 20 using the pivot clamps 22, 22 has the following problems.

The seed chuck 2 which holds the seed crystal 3 is formed, at an upper portion thereof, from metal such as molybdenum for coupling with the pulling shaft 1, but at a lower portion thereof which holds the seed crystal 3, from carbon for preventing metal contamination of the seed crystal 3. When the pivot clamps 22, 22 are not operated, that is, the pivot clamps 22, 22 are set to the close condition from the beginning, the pivot clamps 22, 22 rub a surface of the seed chuck 2 when the seed chuck 2 passes inside the pivot clamps 22, 22, thus there is a possibility that powdered carbon falls to interfere with growing of the single crystal 10.

Also, when the seed chuck 2 enters inside the pivot clamps 22, 22 or comes out therefrom, vibration occurs due to passage of steps, which also has a possibility of interfering growing of the single crystal 10.

When the pivot clamps 22, 22 are set to the open condition, and the pivot clamps 22, 22 are operated to the close condition after the entry of the stopped portion 12 inside the pivot clamps 22, 22, the seed chuck 2 passes inside the pivot clamps 22, 22 without any contact, thereby solving the above described various problems caused by the passage.

However, shifting operation from the open condition to close condition of the pivot clamps 22, 22 is carried out by pushing up the push rod at the body 13 (shoulder) of the single crystal 10, and the push rod needs to be located at a position abutting against the body 13 (shoulder), thereby causing a problem of radially upsizing the crystal holding apparatus 20.

The body 13 (shoulder) has a larger diameter and higher temperature than those of the stopped portion 12, thereby having a possibility of causing contamination by contact with the push rod.

The pivot clamps 22, 22 operated inward by the push rod falls inward by their own weights to collide against a surface of the stopped portion 12. There is also a possibility that this shock inhibits stable growing of the single crystal 10.

SUMMARY OF THE INVENTION

An object of the present invention is to provide a crystal holding apparatus which can solve a problem of carbon falling when a seed chuck passes inside pivot clamps even with a simple structure using the pivot clamps, and can avoid radial upsizing of the apparatus and contamination of a single crystal due to contact with the apparatus.

Another object of the present invention is to provide a crystal holding apparatus which can avoid both collision against the single crystal due to falling of the pivot clamps by their own weights and shock due to the falling per se.

In order to attain the above described objects, a crystal holding apparatus of the invention includes: a frame in which a pulling shaft for growing a single crystal is inserted and which lifts and lowers and rotates for pulling up a grown crystal; a plurality of pivot clamps which are pivotably mounted to a plurality of circumferential positions on the frame for gripping a top of the grown crystal; and a clamp operation mechanism which is incorporated in the frame so as to freely lift and lower, and is pushed up by a seed chuck coupled to a bottom of the pulling shaft to be lifted in the frame, and shifts the plurality of pivot clamps from an open condition to a close condition by the lift.

In the crystal holding apparatus according to the present invention, the plurality of pivot clamps are shifted from the open condition to close condition by the clamp operation mechanism, and by bringing the pivot clamps into the open condition from the beginning, the seed chuck passes inside the pivot clamps without contact. This permits avoiding contact between the pivot clamps and seed chuck. Further, the shift from the open condition to close condition is carried out by pushing up the seed chuck, and lift of the grown crystal is not used for operation of the pivot clamps, permitting avoiding contact between the grown crystal and apparatus.

The clamp operation mechanism preferably has a structure in which the plurality of pivot clamps are shifted from the open condition to close condition when a neck of the grown crystal passes inside the pivot clamps. The pivot clamps make no contact with the narrow neck even in the close condition, so that collision of the pivot clamps against the grown crystal is avoided by shifting the pivot clamps from the open condition to close condition in passage of the neck. The pivot clamps shifted to the close condition then gently pivot along a smooth outer shape of the top of the crystal lifted inside to grip a holding position.

As a specific configuration of the clamp operation mechanism, it is preferable that the plurality of pivot clamps have tapers inclined outward in an upward direction on clamp surfaces which face outward when the respective pivot clamps are in the open condition, and that the clamp operation mechanism has an annular operation member which fits to outsides of the plurality of pivot clamps below the tapers and is pushed by the seed chuck to be lifted in the frame. According to this configuration, the plurality of pivot clamps are synchronously shifted from the open condition to close condition with the simple structure.

The clamp operation mechanism preferably has a configuration in which, when the respective pivot clamps are about to fall in a close direction by their own weights, the falling is inhibited and the respective pivot clamps are rotated in the close direction. According to this configuration, the shift from the open condition to close condition is gradually carried out synchronously with the lift of the seed chuck, thereby preventing shock due to the falling per se of the pivot clamps.

As a specific configuration for inhibiting the falling of the pivot clamps, it is preferable that the plurality of pivot clamps are provided with projections on the clamp surfaces which face outward when the respective pivot clamps are in the open condition, the projections being provided with recesses facing outward and slits for opening the recesses upward, and that the clamp operation mechanism engages a bottom of a downward operation member pushed by the seed chuck to be lifted in the frame with the recesses via the slits.

According to this specific configuration, while the centers of gravity of the pivot clamps are outside the pivots, the pivot clamps are forcedly operated in the close direction with the projections pulled up, and after the centers of gravity of the pivot clamps move inside the pivots, the projections are pushed down to inhibit inward falling of the pivot clamps by their own weights, and the operation member is pulled up from the recesses to release the pivot clamps in the close condition.

The clamp operation mechanism preferably has a configuration in which the pivot clamps are pivotable in the close condition, so that after the shift from the open condition to close condition, the pivot clamps are released to allow passage of the top of the crystal or the like.

DETAILED DESCRIPTION OF THE PREFERRED EMBODIMENTS

Figure 1:
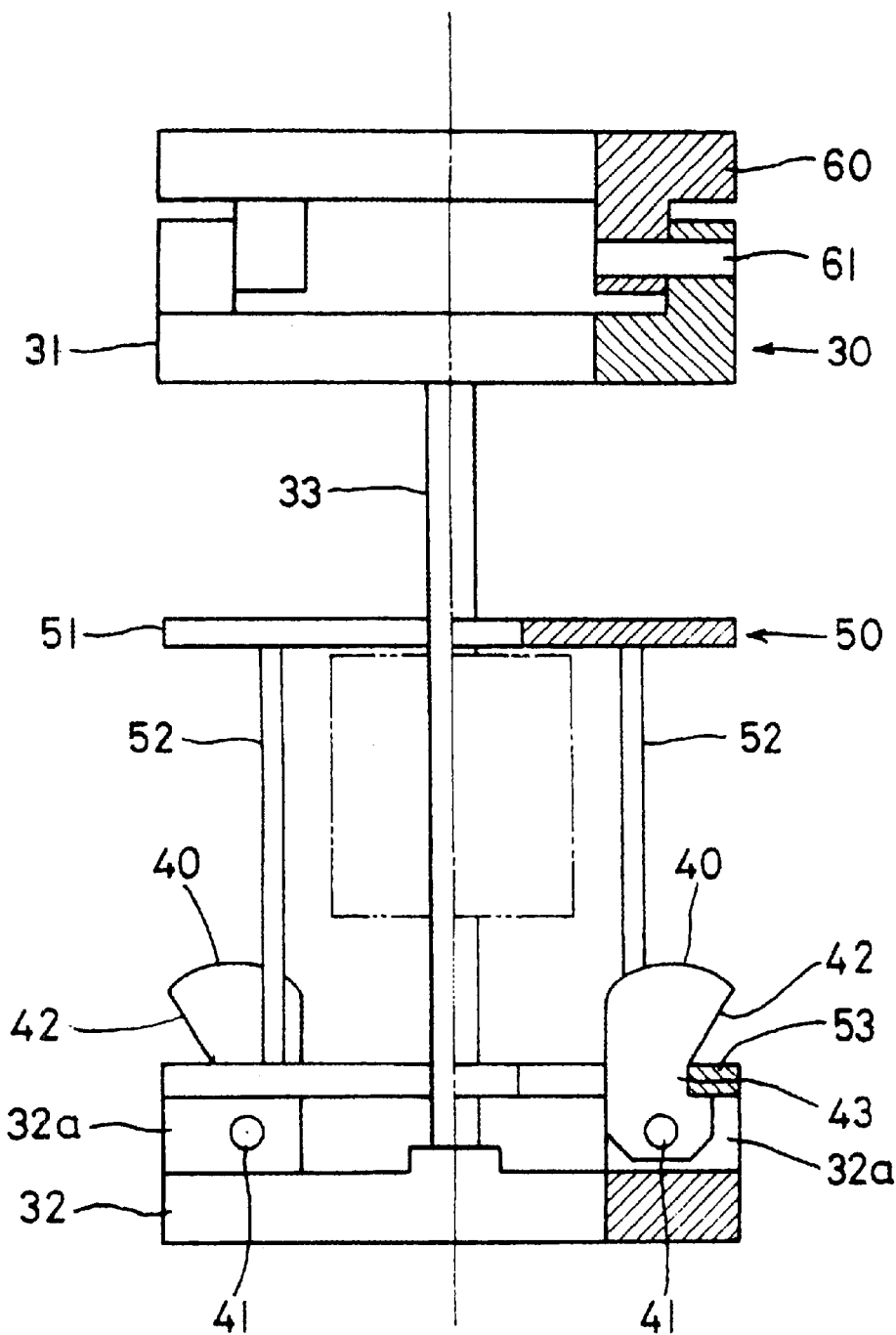
FIG. 1 is a front elevational view of a crystal holding apparatus of a first embodiment of the present invention, and a right half thereof is a vertical sectional view.
Figure 2:
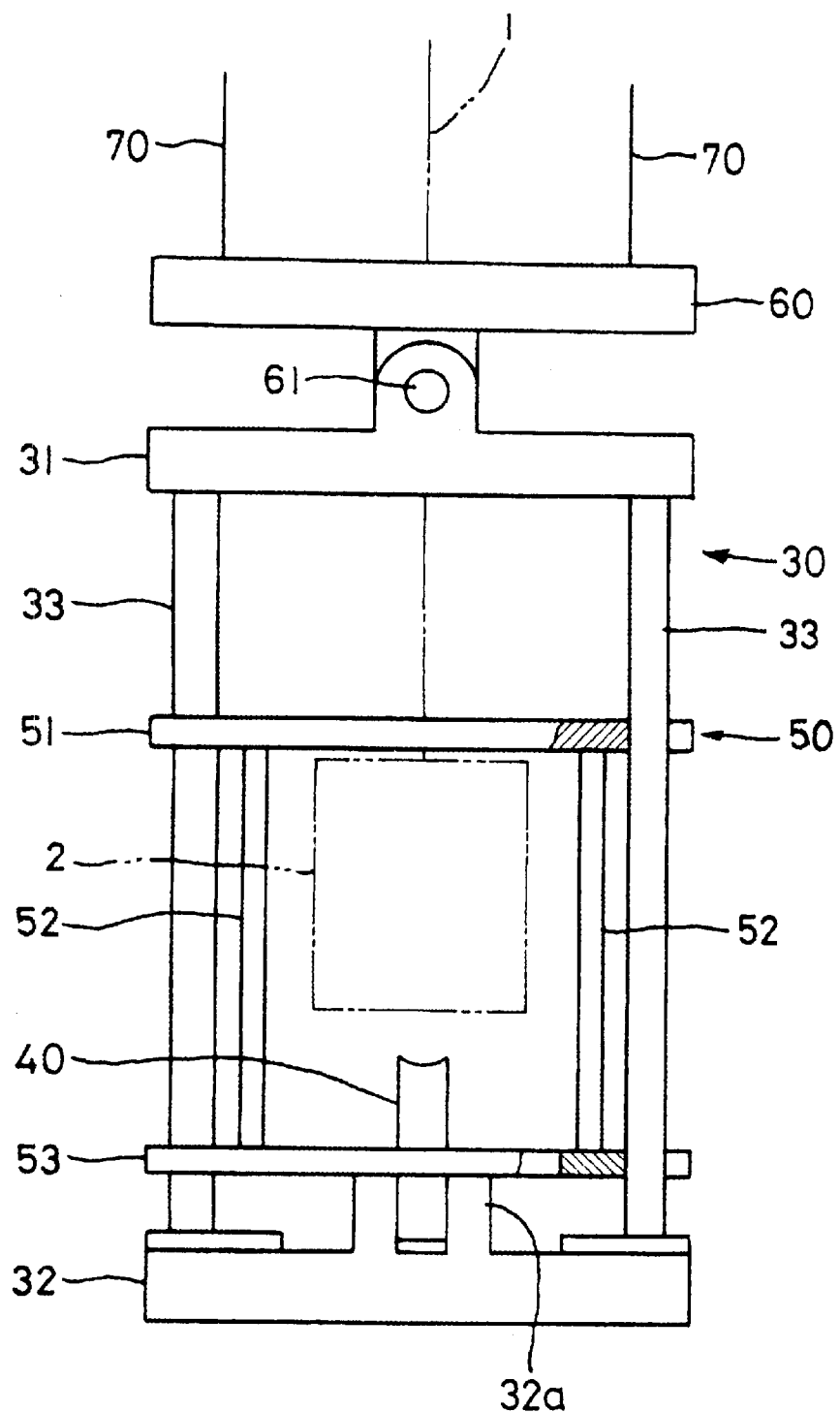
FIG. 2 is a side view of the crystal holding apparatus.

An embodiment of the invention will be described below in detail. FIG. 1 is a front elevational view of a crystal holding apparatus of a first embodiment of the present invention, and a right half thereof is a vertical sectional view, and FIG. 2 is a side view of the crystal holding apparatus.

The crystal holding apparatus of the first embodiment comprises a cylindrical frame 30, a plurality of pivot clamps 40, 40 mounted on the frame 30, and a clamp operation mechanism 50 incorporated in the frame 30 for operating the pivot clamps 40, 40.

The frame 30 is structured in such a manner that an annular upper base 31 and a similarly annular lower base 32 are coupled by a plurality of vertical coupling rods 33, 33. The upper base 31 is suspended by two holding wires 70, 70 via an annular suspension base 60. The suspension base 60 is pivotably coupled to the upper base 31 therebelow by two horizontal shafts 61, 61 perpendicular to a plane including holding wires 70, 70. Thus, the frame 30 can be inclined in two perpendicular directions within a horizontal plane.

Inner diameters of the annular upper base 31, lower base 32 and suspension base 60, respectively are larger than an outer diameter of a seed chuck 2 for allowing passage of the seed chuck 2.

The plurality of pivot clamps 40, 40 are arranged on a plurality of circumferential positions at a bottom of the frame 30 at regular intervals, and each base portion thereof is pivotably supported on a bracket-like support 32a formed on an upper surface of the lower base 32 by a horizontal shaft 41. Each horizontal shaft 41 is perpendicular to a radial direction of the frame 30. Thus, each pivot clamp 40 pivots around the base portion within a radial and vertical surface of the frame 30, horizontally falling inward to cause a close condition and outwardly and vertically standing to cause an open condition. The pivot clamp 40 is pivotable in an open direction in the close condition, and in the open condition, stands by itself resulting from the center of gravity being outside the pivot.

For allowing a stopped portion of a single crystal to be gripped in the close condition, a diameter of a space formed inside the pivot clamps 40, 40 is set larger than a smallest outer diameter of a stopped portion and smaller than a largest outer diameter thereof, and in the open condition, set larger than the outer diameter of the seed chuck 2. An outer diameter of a neck of the single crystal is sufficiently smaller than the smallest outer diameter of the stopped portion.

A clamp operation mechanism 50 comprises an annular lifting/lowering base 51 incorporated in the frame 30 so as to freely lift and lower with coupling rods 33, 33 of the frame 30 as guides, and an annular operation member 53 suspended by a plurality of coupling rods 52, 52 below the lifting/lowering base 51. The annular lifting/lowering base 51 is concentrically arranged in the frame 30, and an inner diameter thereof is set smaller than the outer diameter of the seed chuck 2. Thus, the lifting/lowering base 51 is pushed up by the seed chuck 2 when the seed chuck 2 passes through the frame 30.

Similarly to the lifting/lowering base 51, the operation member 53 is concentrically arranged in the frame 30, and at a lowermost position, placed on the bracket-like supports 32a, 32a formed on the upper surface of the lower base 32. In this state, the operation member 53 is fitted to the outside of the pivot clamps 40, 40 in the open condition supported by the supports 32a, 32a to support the pivot clamps 40, 40 from outward so as to stand in the open condition. The pivot clamps 40, 40 have, at their back, tapered surfaces 42, 42 inclined outward in the open condition, and the operation member 53 fits to necking portions 43, 43 below the tapered surfaces 42, 42. Thus, when the operation member 53 lifts from the lowermost position, the pivot clamps 40, 40 are pushed inward to be shifted to the close condition.

A distance between the lifting/lowering base 51 and operation member 53 is set in such a manner that the pivot clamps 40, 40 are shifted from the open condition to close condition when the neck formed below the seed chuck 2 passes inside the pivot clamps 40, 40.

Next, functions of the crystal holding apparatus of the first embodiment will be described.

At the time of growing the single crystal, the frame 30 waits at a predetermined position. The clamp operation mechanism 50 is located in the lowermost position, and the pivot clamps 40, 40 are set to the open condition. A pulling shaft 1 is suspended downward through the frame 30. A seed crystal is held by the seed chuck 2 connected to a bottom of the pulling shaft 1.

In growing of the single crystal, the seed crystal is first immersed in a melt, and after necking, a stopped portion is formed below a neck to start growing of the body. During growing of the body, the seed chuck 2 lifts with rotation at a predetermined rate. Thus, the seed chuck 2 enters the frame 30 from downward and passes inside the pivot clamps 40, 40. The pivot clamps 40, 40 stand in the open condition, so that the seed chuck 2 passes inside the pivot clamps 40, 40 without contact.

Therefore, falling of powdered carbon and vibration are prevented which causes problems when the seed chuck 2 passes inside the pivot clamps 40, 40 with contact, avoiding harmful influence on crystal growing resulting therefrom.

When the seed chuck 2 further lifts in the frame 30, the seed chuck 2 abuts against the lifting/lowering base 51 of the clamp operation mechanism 50 to push up the lifting/lowering base 51. The operation member 53 of the clamp operation mechanism 50 is thereby lifted, and with the lift, the pivot clamps 40, 40 are pushed inward. After the centers of gravity of the pivot clamps 40, 40 move inside the pivot, the pivot clamps 40, 40 fall inward by their own weights to be naturally shifted to the close condition.

At this time, the neck of the single crystal passes inside the pivot clamps 40, 40, so that the pivot clamps 40, 40 having fallen inward do not collide against the single crystal. Thus, harmful influence due to the collision is avoided. Also, the shift of the pivot clamps 40, 40 from the open condition to close condition is carried out by pushing up of the seed chuck 2, and the body of the single crystal is not used, thereby avoiding contamination of the body and radial upsizing of the crystal holding apparatus which are the problems caused in using the body.

The pivot clamps 40, 40 fall inward to be thereby released from the clamp operation mechanism 50 and to become pivotable upward in the close condition. Even after falling, the clamp operation mechanism 50 continues lifting in the frame 30 for a while. During this time, the stopped portion of the single crystal enters inside the pivot clamps 40, 40, and the stopped portion is gripped by the pivot clamps 40, 40. The stopped portion of the single crystal has a smooth outer shape unlike the seed chuck 2 to thereby gently push up the pivot clamps 40, 40 and enter therein. Therefore, pivot operation of the pivot clamps 40, 40 when the stopped portion of the single crystal enters has no harmful influence on single crystal growing.

When the stopped portion of the single crystal is gripped by the pivot clamps 40, 40, the frame 30 starts rotating and lifting synchronously with the seed chuck 2. After that, the single crystal is mechanically held and pulled up by the crystal holding apparatus.

Figure 3:
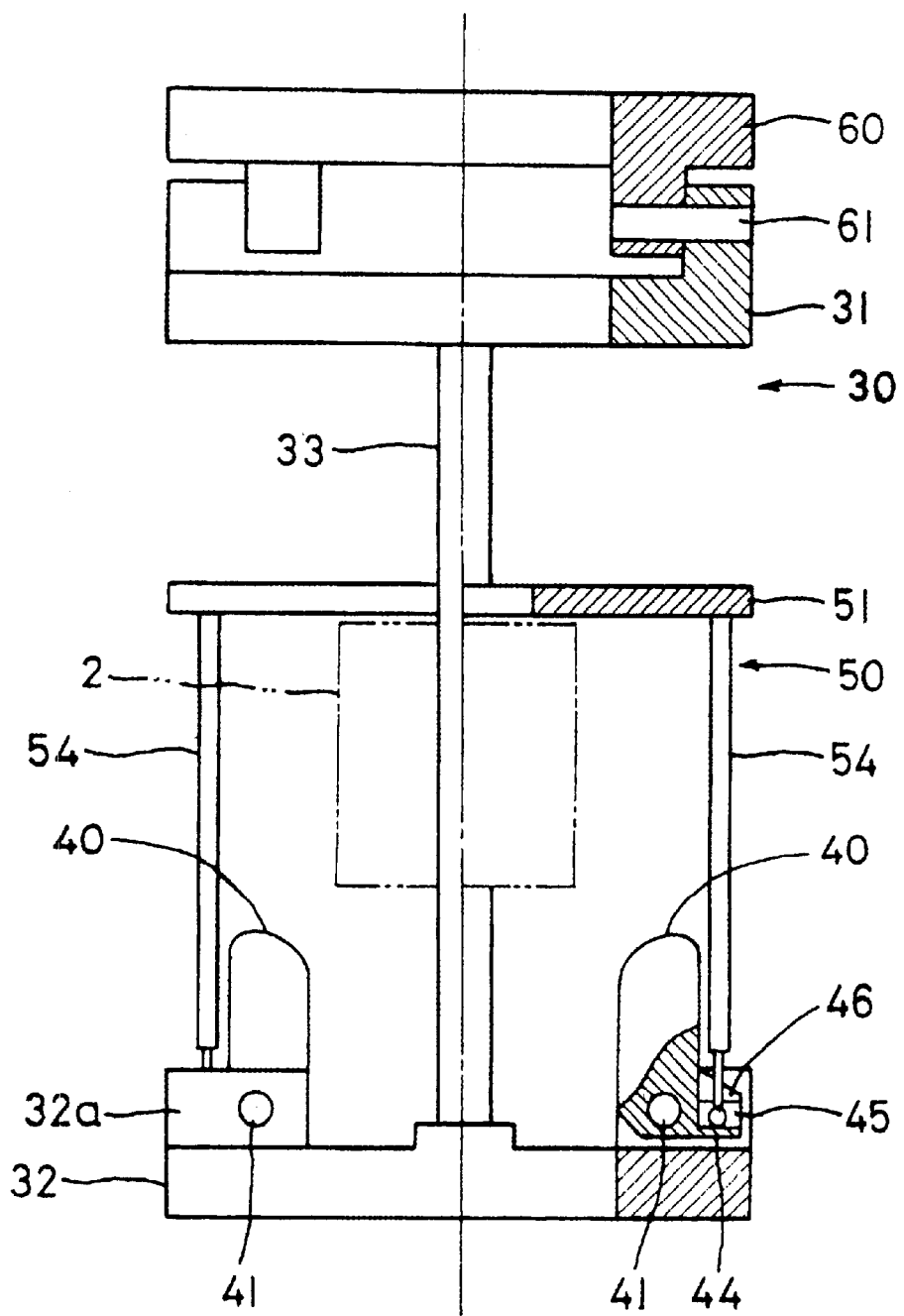
FIG. 3 is a front elevational view of a crystal holding apparatus of a second embodiment of the present invention, and a right half thereof is a vertical sectional view.
Figure 4:
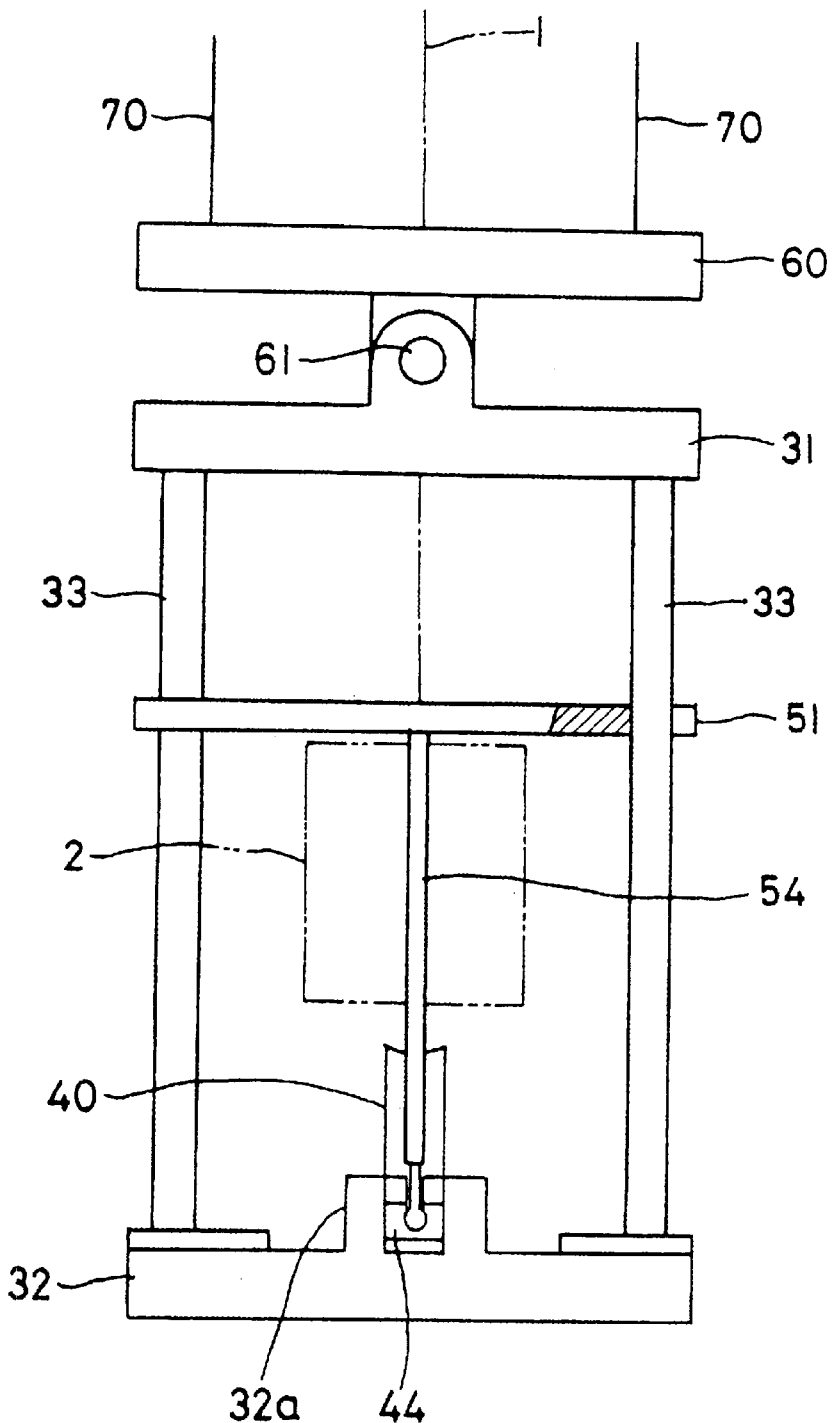
FIG. 4 is a side view of the crystal holding apparatus.
Figure 5:
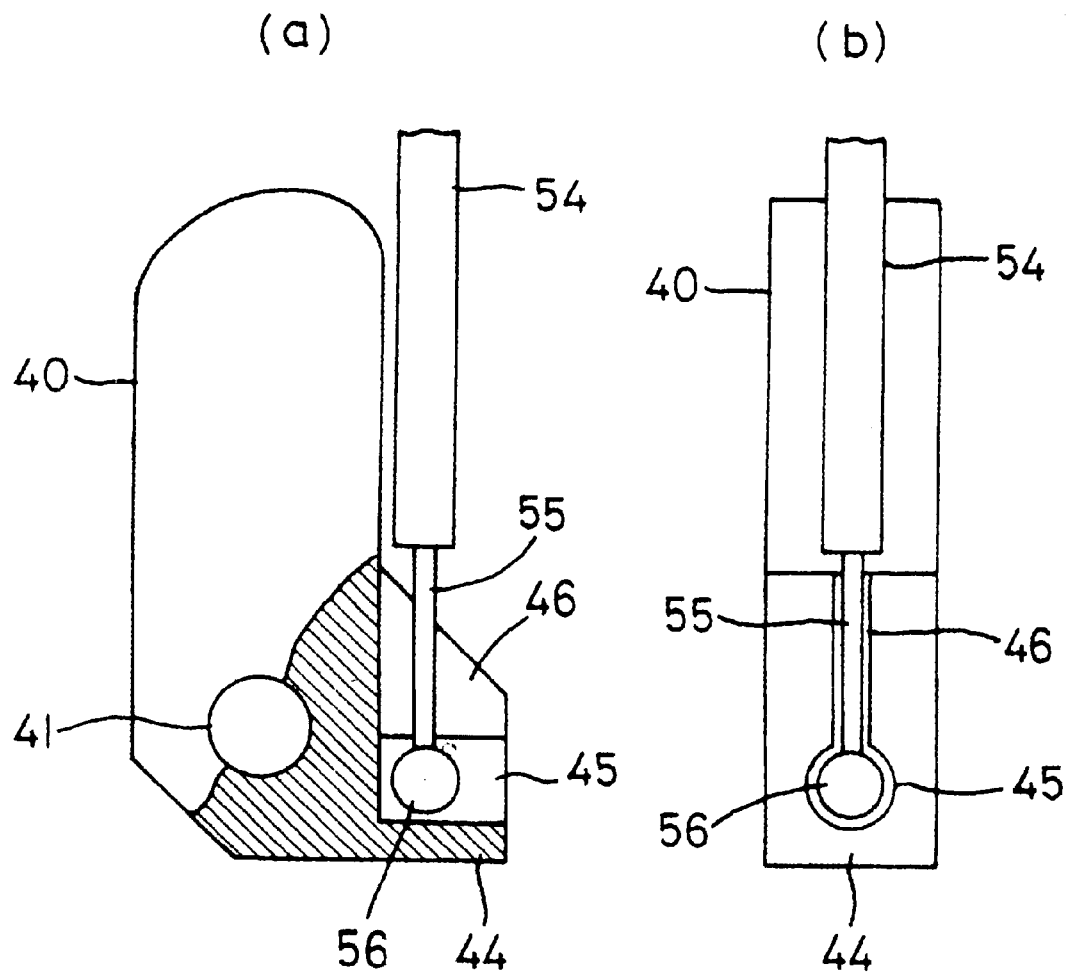
FIG. 5A is a side view, partly broken away, of a pivot clamp showing essential portions of the crystal holding apparatus.
FIG. 5B is a front elevational view of the pivot clamp.
Figure 6:
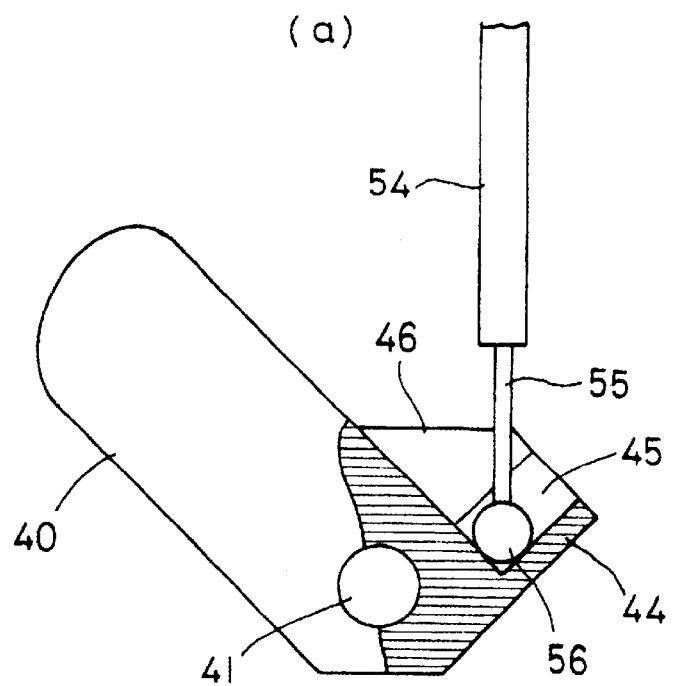
FIGS. 6A and 6B are side views, partly broken away, of the pivot clamp showing stepwise operation of the essential portions.
Figure 6:
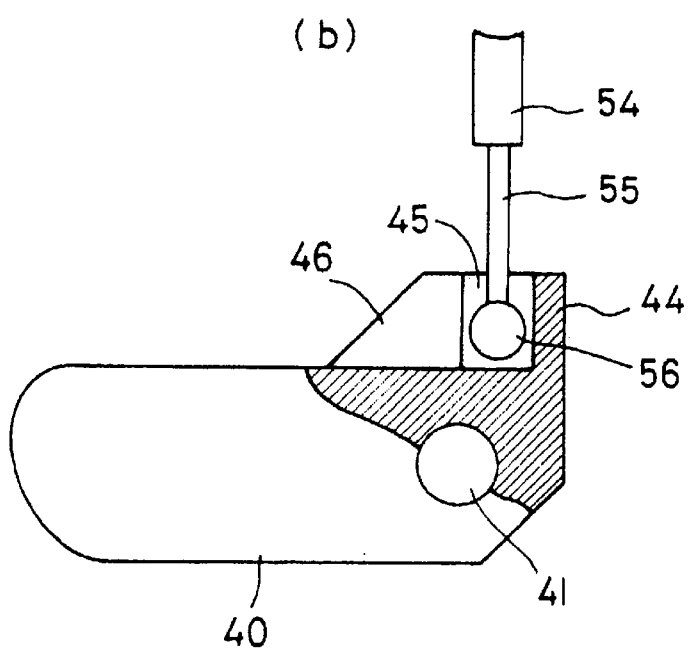
Figure 7:
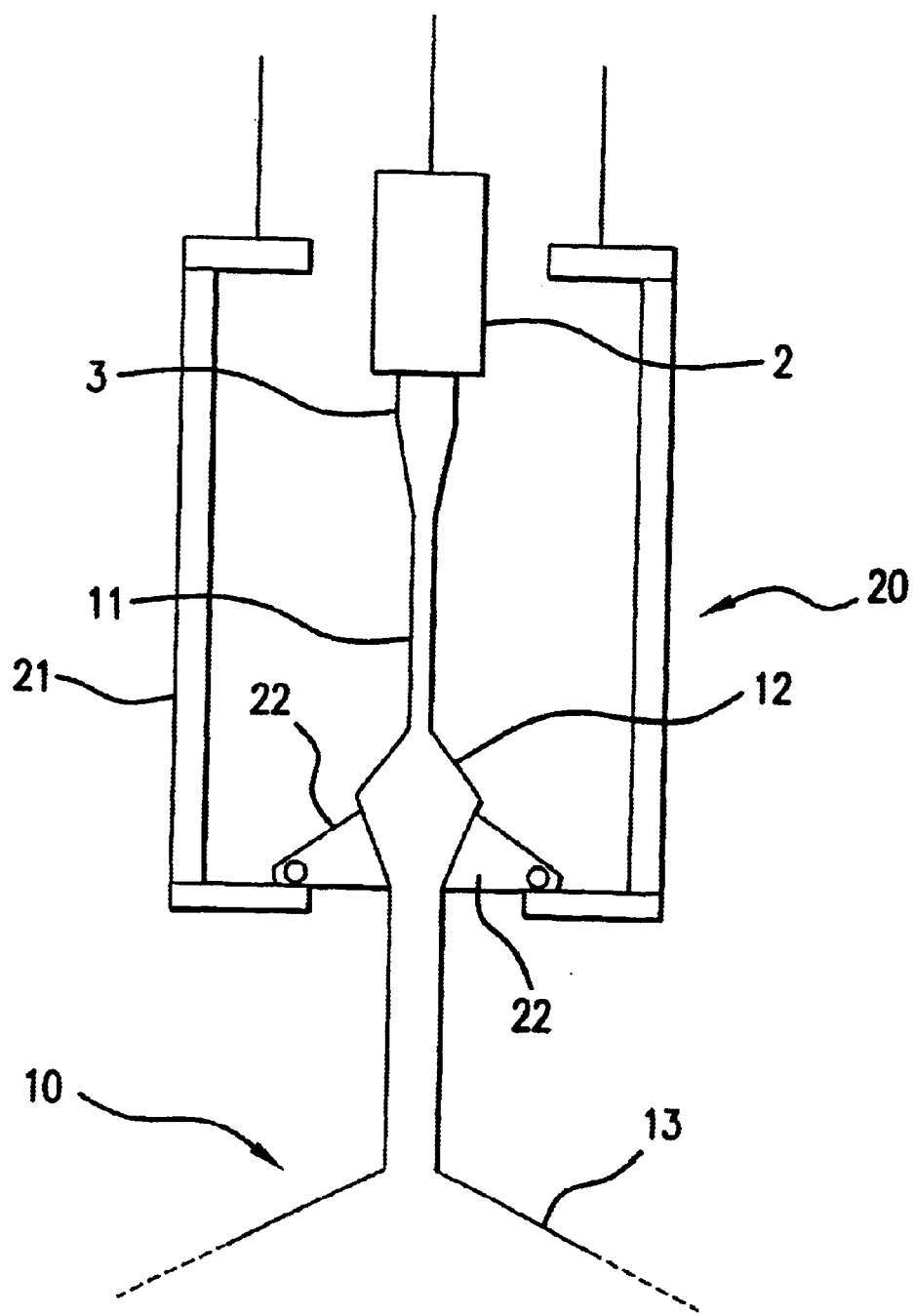
FIG. 7 is a conceptual view of crystal holding and pulling.

FIG. 3 is a front elevational view of a crystal holding apparatus of a second embodiment of the invention, and a right half thereof is a vertical sectional view, FIG. 4 is a side view of the crystal holding apparatus, FIG. 5A is a side view, partly broken away, of a pivot clamp showing essential portions of the crystal holding apparatus, FIG. 5B is a front elevational view of the pivot clamp, and FIGS. 6A and 6B are side views, partly broken away, of the pivot clamp showing stepwise operation of the essential portions.

The crystal holding apparatus of the second embodiment is mainly different from the crystal holding apparatus of the first embodiment in structures of the pivot clamps 40, 40 and clamp operation mechanism 50. The structures of other portions are substantially the same as in the crystal holding apparatus of the first embodiment, so that the same portions are designated with the same reference numerals, and descriptions thereof will be omitted.

As shown in FIG. 5 in detail, each of pivot clamps 40, 40 comprises a projection 44 projecting outward on a surface which faces outward in an open condition. The projection 44 is located at a base portion of the pivot clamp 40. The projection 44 is provided from outward with a recess 45 having a circular section, and provided from upward with a slit 46 such as to communicate with the recess 45. A width of the slit 46 is smaller than an inner diameter of the recess 45.

A clamp operation mechanism 50 comprises a plurality of rod-like operation members 54, 54 extending downward from a lifting/lowering base 51. Each of the operation members 54, 54 has a narrowed portion 55 therebelow, and a spherical engagement portion 56 below the narrowed portion 55 (bottom) The narrowed portion 55 is inserted in the slit 46 from outward, and the engagement portion 56 is inserted in the recess 45 from outward. By the insertion of the engagement portion 56 in the recess 45 from outward, the engagement portion 56 is brought into an engaged condition with the projection 44 from upward.

In growing of the single crystal, similarly to the first embodiment, the crystal holding apparatus waits for entry of a seed chuck 2 in a waiting position with the pivot clamps 40, 40 in the open condition. With growth of the single crystal, the seed chuck 2 enters the frame 30 from downward and passes inside the pivot clamps 40, 40. The pivot clamps 40, 40 stand in the open condition, so that the seed chuck 2 passes inside the pivot clamps 40, 40 without contact.

When the seed chuck 2 further lifts in the frame 30, the seed chuck 2 abuts against the lifting/lowering base 51 of the clamp operation mechanism 50 to push up the lifting/lowering base 51. The operation members 54, 54 of the clamp operation mechanism 50 are thereby lifted, and with the lift, the projections 44, 44 of the pivot clamps 40, 40 are pulled up by the engagement portions 56, 56. Thus, the pivot clamps 40, 40 are inclined inward with the lift of operation members 54, 54. The narrowed portions 55, 55 inserted in the slits 46, 46 do not inhibit inclination of the pivot clamps 40, 40.

As shown in FIG. 6A, after inclination angles of the pivot clamps 40, 40 are increased and the centers of gravity of the pivot clamps 40, 40 move to inside from the pivotal center, the pivot clamps 40, 40 are about to fall inward by their own weights, but the engagement portions 56, 56 of the operation members 54, 54 push down the projections 44, 44 to inhibit the falling. Thus, the pivot clamps 40, 40 are gradually inclined inward synchronously with the lift of the seed chuck 2 even after the centers of gravity of the pivot clamps 40, 40 move to inside from the pivotal center.

That is, while the centers of gravity of the pivot clamps 40, 40 are outside the pivotal center, the engagement portions 56, 56 of the operation members 54, 54 pull up the projections 44, 44 of the pivot clamps 40, 40 to thereby forcedly operate the pivot clamps 40, 40 in the close direction, and after the centers of gravity of the pivot clamps 40, 40 move inside the pivotal center, the engagement portions 56, 56 push down the projections 44, 44 of the pivot clamps 40, 40 to thereby inhibit inward falling of the pivot clamps 40, 40 by their own weights and gently shift the pivot clamps 40, 40 to the close condition Therefore, the crystal holding apparatus of the second embodiment can avoid shock due to inward falling of the pivot clamps 40, 40 by their own weights and also harmful influence on crystal growing due to the shock.

When the pivot clamps 40, 40 are shifted to the close condition, as shown in FIG. 6B, horizontal falling of the pivot clamps 40, 40 causes the projections 44, 44 to face straight up. Thus, the engagement portions 56, 56 of the operation members 54, 54 are smoothly pulled out from the recesses 45, 45 to release the pivot clamps 40, 40.

Accordingly, the engagement portions 56, 56 of the operation members 54, 54 constrain the pivot clamps 40, 40 over a period before the close condition, but in the close condition, ensure free pivoting of the pivot clamps 40, 40 and do not inhibit entry and grip of the stopped portion of the single crystal.

As described above, the crystal holding apparatus of the invention shifts the pivot clamp from the open condition to close condition, thereby avoiding harmful influence on the crystal growing due to contact between the pivot clamp and seed chuck. Further, the shift of the pivot clamp from the open condition to close condition is carried out by pushing up of the seed chuck, thereby also avoiding harmful influence on the crystal growing due to the contact between a grown crystal and the apparatus when shifting. Accordingly, stable growing can be ensured even though a top of the single crystal is mechanically held. Moreover, the apparatus can be minimized.

The apparatus may be configured in such a manner that the pivot clamps are shifted from the open condition to close condition when the neck of the grown crystal passes inside the plurality of pivot clamps, thereby avoiding harmful influence on the crystal growing due to the collision of the clamps against the grown crystal.

The apparatus may be configured in such a manner that when the pivot clamps are in the state of falling in the close direction by their own weights, the falling is inhibited and the respective pivot clamps are rotated in the close direction, thereby preventing shock due to the falling per se of the pivot clamps and harmful influence on the crystal growing resulting therefrom.

What is claimed is:

1. A crystal holding apparatus which holds and pulls up a single crystal grown by a CZ method at a top thereof, comprising:
  a frame in which a pulling shaft for growing the single crystal is inserted and which lifts and lowers and rotates for pulling up a grown crystal;
  a plurality of pivot clamps which are pivotably mounted to a plurality of circumferential positions on the frame for gripping the top of the grown crystal; and
  a clamp operation mechanism which is incorporated in the frame so as to freely lift and lower, and is pushed up by a seed chuck coupled to a bottom of the pulling shaft to be lifted in the frame, and shifts the plurality of pivot clamps from an open condition to a close condition by the lift.

2. The crystal holding apparatus according to claim 1, wherein said clamp operation mechanism has a configuration in which the plurality of pivot clamps are shifted from the open condition to close condition when a neck of the grown crystal passes inside the pivot clamps.

3. The crystal holding apparatus according to claim 1, wherein the plurality of pivot clamps have tapers inclined outward in an upward direction on surfaces which face outward in the open condition, and the clamp operation mechanism has an annular operation member which fits to outsides of the plurality of pivot clamps below the tapers and is pushed by the seed chuck to be lifted in the frame.

4. The crystal holding apparatus according to claim 1, wherein said clamp operation mechanism has a structure in which, when the respective pivot clamps are about to fall in a close direction by their own weights, the falling is inhibited and the respective pivot clamps are rotated in the close direction.

5. The crystal holding apparatus according to claim 4, wherein the plurality of pivot clamps are provided with projections on clamp surfaces which face outward when the respective pivot clamps are in the open condition, the projections being provided with recesses facing outward and slits for opening the recesses upward, and the clamp operation mechanism engages a bottom of a downward operation member pushed by the seed chuck to be lifted in the frame with the recesses via the slits.

6. The crystal holding apparatus according to claim 3, wherein said clamp operation mechanism has a structure in which, when the respective pivot clamps are about to fall in a close direction by their own weights, the falling is inhibited and the respective pivot clamps are rotated in the close direction.

7. The crystal holding apparatus according to claim 6, wherein the plurality of pivot clamps are provided with projections on clamp surfaces which face outward when the respective pivot clamps are in the open condition, the projections being provided with recesses facing outward and slits for opening the recesses upward, and the clamp operation mechanism engages a bottom of a downward operation member pushed by the seed chuck to be lifted in the frame with the recesses via the slits.

8. The crystal holding apparatus according to claim 2, wherein the plurality of pivot clamps have tapers inclined outward in an upward direction on surfaces which face outward in the open condition, and the clamp operation mechanism has an annular operation member which fits to outsides of the plurality of pivot clamps below the tapers and is pushed by the seed chuck to be lifted in the frame.

9. The crystal holding apparatus according to claim 8, wherein said clamp operation mechanism has a structure in which, when the respective pivot clamps are about to fall in a close direction by their own weights, the falling is inhibited and the respective pivot clamps are rotated in the close direction.

10. The crystal holding apparatus according to claim 9, wherein the plurality of pivot clamps are provided with projections on clamp surfaces which face outward when the respective pivot clamps are in the open condition, the projections being provided with recesses facing outward and slits for opening the recesses upward, and the clamp operation mechanism engages a bottom of a downward operation member pushed by the seed chuck to be lifted in the frame with the recesses via the slits.

11. The crystal holding apparatus according to claim 2, wherein said clamp operation mechanism has a structure in which, when the respective pivot clamps are about to fall in a close direction by their own weights, the falling is inhibited and the respective pivot clamps are rotated in the close direction.

12. The crystal holding apparatus according to claim 11, wherein the plurality of pivot clamps are provided with projections on clamp surfaces which face outward when the respective pivot clamps are in the open condition, the projections being provided with recesses facing outward and slits for opening the recesses upward, and the clamp operation mechanism engages a bottom of a downward operation member pushed by the seed chuck to be lifted in the frame with the recesses via the slits.

* * * * *